(12) United States Patent
Gilbert et al.

(10) Patent No.: US 10,804,875 B2
(45) Date of Patent: Oct. 13, 2020

(54) POLYMER LID WAFER-LEVEL PACKAGE WITH AN ELECTRICALLY AND THERMALLY CONDUCTIVE PILLAR

(71) Applicant: Avago Technologies International Sales Pte. Limited, Singapore (SG)

(72) Inventors: Stephen Roy Gilbert, San Francisco, CA (US); Martin Franosch, Munich (DE); Suresh Sridaran, Fort Collins, CO (US); Andrew Thomas Barfknecht, Menlo Park, CA (US); Richard C. Ruby, Menlo Park, CA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 477 days.

(21) Appl. No.: 15/720,374

(22) Filed: Sep. 29, 2017

(65) Prior Publication Data
US 2019/0103852 A1    Apr. 4, 2019

(51) Int. Cl.
*H03H 9/17* (2006.01)
*H03H 9/02* (2006.01)
(Continued)

(52) U.S. Cl.
CPC ......... *H03H 9/02897* (2013.01); *H01L 24/11* (2013.01); *H01L 24/13* (2013.01); *H01L 41/0477* (2013.01); *H03H 3/02* (2013.01); *H03H 3/08* (2013.01); *H03H 9/02102* (2013.01); *H03H 9/02834* (2013.01); *H03H 9/059* (2013.01); *H03H 9/0523* (2013.01); *H03H 9/1014* (2013.01); *H03H 9/1071* (2013.01); *H03H 9/145* (2013.01); *H03H 9/25* (2013.01); *H01L 41/29* (2013.01); *H01L 2224/11462* (2013.01);
(Continued)

(58) Field of Classification Search
CPC .. H03H 9/02897; H03H 9/059; H03H 9/1071; H03H 9/145; H03H 9/25; H03H 9/02834; H01L 41/0477
See application file for complete search history.

(56) References Cited

U.S. PATENT DOCUMENTS 5,587,620 A    12/1996 Ruby et al.
5,873,153 A    2/1999 Ruby et al.
(Continued)

OTHER PUBLICATIONS

US 5,107,721 A, 08/2000, Lakin (withdrawn)
(Continued)

*Primary Examiner* — J. San Martin
(74) *Attorney, Agent, or Firm* — Foley & Lardner LLP

(57) ABSTRACT

An apparatus include a device substrate having an upper surface, and a frame layer having an upper surface. The frame layer is disposed over the upper surface of the device substrate, and a first opening exists in the frame layer. The apparatus also includes a seed layer disposed over the device substrate and substantially bounded by the first opening; and a lid layer having an upper surface. The lid layer is disposed over the upper surface of the frame layer. A second opening exists in the lid layer, and the second opening is aligned with the first opening. The apparatus also includes an electrically and thermally conductive pillar disposed in the first opening and the second opening.

24 Claims, 9 Drawing Sheets

(51) Int. Cl.
*H03H 9/05* (2006.01)
*H03H 9/10* (2006.01)
*H03H 9/145* (2006.01)
*H03H 9/25* (2006.01)
*H03H 3/08* (2006.01)
*H01L 23/00* (2006.01)
*H01L 41/047* (2006.01)
*H03H 3/02* (2006.01)
*H01L 41/29* (2013.01)

(52) U.S. Cl.
CPC ............... *H01L 2224/13082* (2013.01); *H01L 2224/13147* (2013.01); *H01L 2224/13155* (2013.01); *H01L 2224/13564* (2013.01); *H01L 2224/13611* (2013.01); *H01L 2224/13616* (2013.01); *H01L 2224/13639* (2013.01); *H01L 2224/13647* (2013.01); *H01L 2924/014* (2013.01); *H01L 2924/351* (2013.01); *H03H 9/171* (2013.01)

(56) References Cited

U.S. PATENT DOCUMENTS

| | | | |
|---|---|---|---|
| 6,507,983 | B1 | 1/2003 | Ruby et al. |
| 6,828,713 | B2 | 12/2004 | Bradley et al. |
| 6,955,950 | B2 | 10/2005 | Aigner et al. |
| 7,280,007 | B2 | 10/2007 | Feng et al. |
| 7,300,823 | B2 | 11/2007 | Franosch et al. |
| 7,345,410 | B2 | 3/2008 | Grannen et al. |
| 7,358,831 | B2 | 4/2008 | Larson, III et al. |
| 7,369,013 | B2 | 5/2008 | Fazzio et al. |
| 7,388,454 | B2 | 6/2008 | Ruby et al. |
| 7,561,009 | B2 | 7/2009 | Larson, III et al. |
| 7,629,865 | B2 | 12/2009 | Ruby et al. |
| 7,692,317 | B2 | 4/2010 | Franosch et al. |
| 7,714,684 | B2 | 5/2010 | Ruby et al. |
| 7,791,434 | B2 | 9/2010 | Fazzio et al. |
| 8,188,810 | B2 | 5/2012 | Fazzio et al. |
| 8,230,562 | B2 | 7/2012 | Fazzio et al. |
| 8,248,185 | B2 | 8/2012 | Choy et al. |
| 8,436,516 | B2 | 5/2013 | Ruby et al. |
| 8,673,121 | B2 | 3/2014 | Larson, III et al. |
| 8,902,023 | B2 | 12/2014 | Choy et al. |
| 8,981,876 | B2 | 3/2015 | Jamneala et al. |
| 9,136,819 | B2 | 9/2015 | Larson, III et al. |
| 9,197,185 | B2 | 11/2015 | Zou et al. |
| 9,243,316 | B2 | 1/2016 | Larson, III et al. |
| 9,450,167 | B2 | 9/2016 | Zou et al. |
| 9,455,681 | B2 | 9/2016 | Feng et al. |
| 9,479,139 | B2 | 10/2016 | Ruby et al. |
| 9,484,882 | B2 | 11/2016 | Burak et al. |
| 9,590,165 | B2 | 3/2017 | Zou et al. |
| 9,602,073 | B2 | 3/2017 | Larson, III et al. |
| 9,679,765 | B2 | 6/2017 | Larson, III et al. |
| 2006/0096945 | A1 | 5/2006 | Shen |
| 2009/0096321 | A1 | 4/2009 | Aikawa et al. |
| 2010/0301708 | A1* | 12/2010 | Tsuda ................. H03H 9/059 310/344 |
| 2012/0326807 | A1 | 12/2012 | Choy et al. |
| 2013/0015747 | A1 | 1/2013 | Ruby et al. |
| 2015/0194948 | A1* | 7/2015 | Inate ............... H03H 9/02913 333/133 |
| 2015/0249438 | A1* | 9/2015 | Hira ................... H03H 9/059 310/313 C |
| 2016/0190423 | A1* | 6/2016 | Tsubokawa ........... H03H 3/08 310/313 B |
| 2016/0380611 | A1* | 12/2016 | Kai ................. H03H 9/02574 310/313 B |
| 2017/0063329 | A1 | 3/2017 | Gilbert et al. |
| 2017/0063331 | A1 | 3/2017 | Gilbert et al. |
| 2017/0063333 | A1 | 3/2017 | Gilbert et al. |
| 2017/0163243 | A1* | 6/2017 | Bulger ............... H03H 9/1071 |
| 2017/0214386 | A1* | 7/2017 | Kido ................... H03H 9/25 |

OTHER PUBLICATIONS

Co-pending U.S. Appl. No. 15/445,643, filed Feb. 28, 2017.
Co-pending U.S. Appl. No. 15/639,124, filed Jun. 30, 2017.
Co-pending U.S. Appl. No. 15/661,468, filed Jun. 27, 2017.

\* cited by examiner

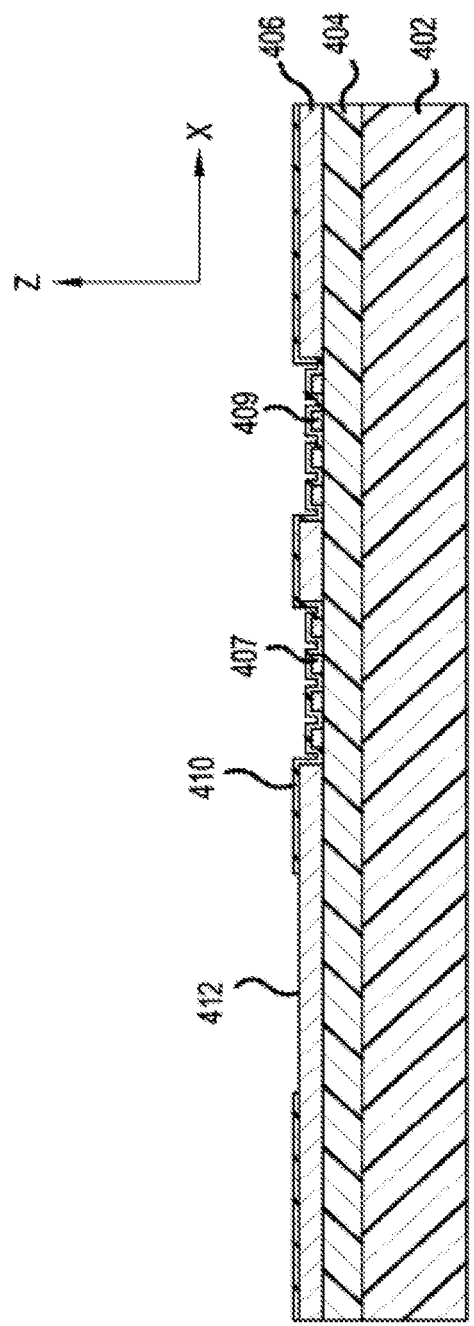
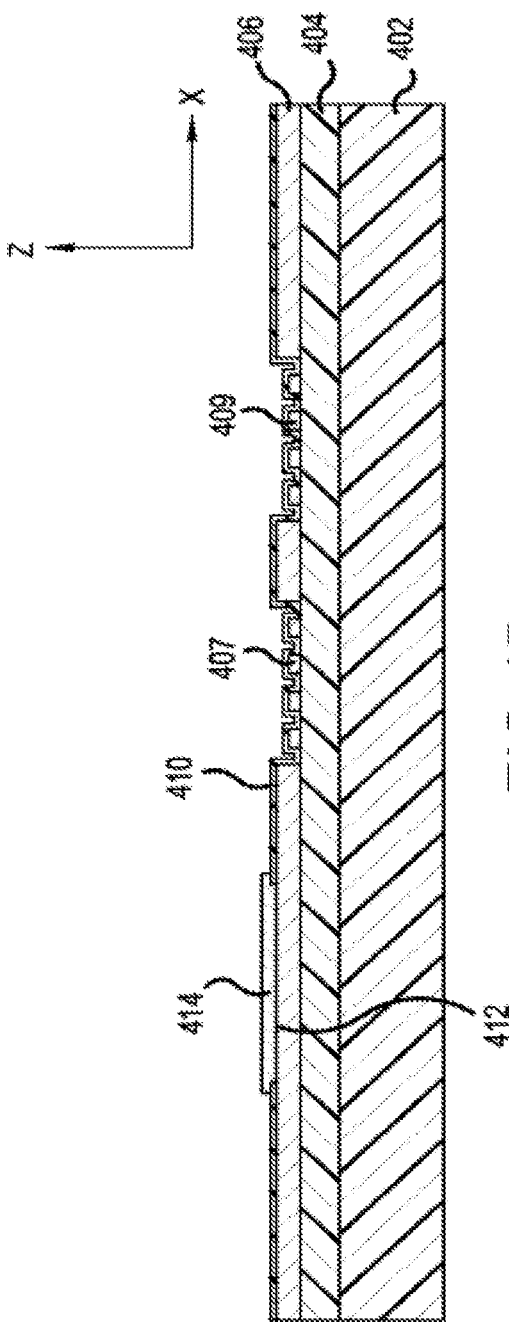
FIG.4A
FIG.4B

POLYMER LID WAFER-LEVEL PACKAGE WITH AN ELECTRICALLY AND THERMALLY CONDUCTIVE PILLAR

BACKGROUND

Electrical resonators are widely incorporated in modern electronic devices. For example, in wireless communications devices, radio frequency (RF) and microwave frequency resonators are used in filters, such as filters having electrically connected series and shunt resonators forming ladder and lattice structures. The filters may be included in a multiplexer, such as a duplexer, for example, connected between an antenna (or multiple antennas as in the case of multiple input, multiple output (MIMO) designs) and a transceiver for filtering received and transmitted signals, typically within a predetermined radio frequency band. Other types of multiplexers in which the filters may be included are diplexers, triplexers, quadplexers, quintplexers and the like, for example. The multiplexer interfaces between the antenna and each of various networks to enable transmitting signals on different transmit (uplink) frequencies and receiving signals on different receive (downlink) frequencies. The filters associated with the multiplexer typically include band pass filters, which provide passbands for passing various transmitted and received signals through relatively narrow frequency bands (blocking all signals with frequencies outside the passbands).

Various types of filters use mechanical or acoustic resonators, such as bulk acoustic wave (BAW) and surface acoustic wave (SAW) resonators. The mechanical/acoustic resonators convert electrical signals to mechanical signals or vibrations, and/or convert mechanical signals or vibrations to electrical signals. These acoustic resonators are often packaged, and incorporated into a multiplexer or other circuit.

During operation, heat is generated, and can adversely impact the function of the acoustic resonator, and ultimately the device into which the acoustic resonator is incorporated. As such, effort has been made to include one form of heat dissipation, or another. Often, electrical grounding of the device into which the acoustic resonator is incorporated is effected using the same component used for heat dissipation.

While certain known techniques aimed at thermal grounding, or electrical grounding, or both, have been advanced in the art, there are shortcomings and deficiencies that are associated with these known techniques.

What is needed, therefore, is a package for an acoustic resonator that overcomes at least the shortcomings of known structures described above.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals, refer to like elements.

FIGS. 4A-4E are cross-sectional views of a process for fabricating an apparatus according to a representative embodiment.

DETAILED DESCRIPTION

Figure 1:
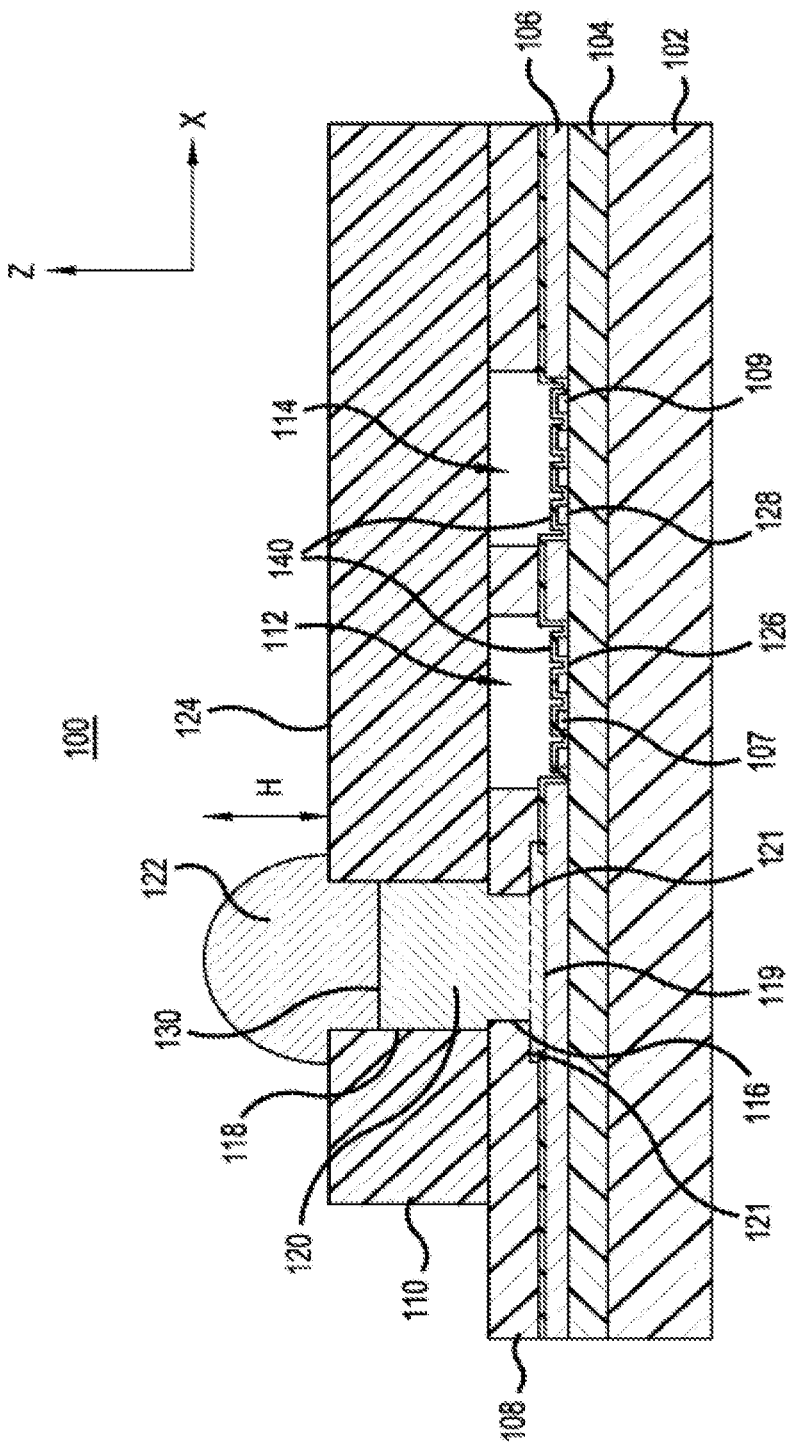
FIG. 1 is a cross-sectional view of an apparatus comprising an electrically and thermally conductive pillar according to a representative embodiment.

In the following detailed description, for purposes of explanation and not limitation, representative embodiments disclosing specific details are set forth in order to provide a thorough understanding of the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the representative embodiments. Such methods and apparatuses are clearly within the scope of the present teachings.

It is to be understood that the terminology used herein is for purposes of describing particular embodiments only, and is not intended to be limiting. Any defined terms are in addition to the technical and scientific meanings of the defined terms as commonly understood and accepted in the technical field of the present teachings.

As used in the specification and appended claims, the terms 'a', 'an' and 'the' include both singular and plural referents, unless the context clearly dictates otherwise. Thus, for example, 'a device' includes one device and plural devices.

As used in the specification and appended claims, and in addition to their ordinary meanings, the terms 'substantial' or 'substantially' mean to with acceptable limits or degree. For example, 'substantially cancelled' means that one skilled in the art would consider the cancellation to be acceptable.

As used in the specification and the appended claims and in addition to its ordinary meaning, the term 'approximately' means to within an acceptable limit or amount to one having ordinary skill in the art. For example, 'approximately the same' means that one of ordinary skill in the art would consider the items being compared to be the same.

Relative terms, such as "above," "below," "top," "bottom," "upper" and "lower" may be used to describe the various elements' relationships to one another, as illustrated in the accompanying drawings. These relative terms are intended to encompass different orientations of the device and/or elements in addition to the orientation depicted in the drawings. For example, if the device were inverted with respect to the view in the drawings, an element described as "above" another element, for example, would now be "below" that element. Similarly, if the device were rotated by 90° with respect to the view in the drawings, an element described "above" or "below" another element would now be "adjacent" to the other element; where "adjacent" means either abutting the other element, or having one or more layers, materials, structures, etc., between the elements.

In accordance with a representative embodiment, an apparatus comprises: a device substrate having an upper surface;

and a frame layer having an upper surface. The frame layer is disposed over the upper surface of the device substrate, and a first opening exists in the frame layer. The apparatus also comprises: a seed layer disposed over the device substrate and substantially bounded by the first opening; and a lid layer having an upper surface. The lid layer is disposed over the upper surface of the frame layer, a second opening exists in the lid layer, and the second opening is aligned with the first opening. The apparatus also comprises an electrically and thermally conductive pillar disposed in the first opening and the second opening. The electrically and thermally conductive pillar has an upper surface that is beneath the upper surface of the lid layer. The apparatus also comprises an electrically and thermally conductive layer disposed over the upper surface of the electrically and thermally conductive pillar, and extends above the upper surface of the lid layer.

FIG. 1 is a cross-sectional view of an apparatus 100 comprising an electrically and thermally conductive pillar 120 according to a representative embodiment. The apparatus 100 may also be referred to as a wafer-level package for reasons that will become clearer as the present description continues.

The apparatus 100 comprises a device substrate 102, and a piezoelectric layer 104 disposed thereover. An electrical contact layer 106 (e.g., a metal layer) is provided over the device substrate 102 and the piezoelectric layer 104, and allows the flow of current to various components of the apparatus 100, some of which are described more fully below. As will be appreciated, the electrical contact layer 106 may comprise circuit traces (not shown) for carrying current to various components of the apparatus 100. First electrodes 107 and second electrodes 109 are disposed over the piezoelectric layer 104.

A frame layer 108 is disposed over the electrical contact layer 106, and comprises a photo-definable polymer material, the use and benefits thereof being described more fully below.

A lid layer 110 is disposed over the frame layer 108, and generally comprises a same material as the frame layer 108. A first cavity 112 and a second cavity 114 are formed in the frame layer 108, and the lid layer 110 provides a cover for each of the first and second cavities 112, 114. It is noted that the inclusion of two cavities in the apparatus 100 is merely illustrative, and more or fewer cavities, covered by the lid layer, are contemplated. Beneficially, the first and second cavities 112, 114, which are formed by frame layer 108 and lid layer 110, are substantially hermetically sealed, thereby preventing an appreciable degree of contaminants from entering the first and second cavities 112, 114. Generally, the first and second cavities 112, 114 provide sufficient hermeticity to prevent subsequently deposited mold compound (not shown) from entering the first and second cavities 112, 114. The first and second cavities 112, 114 may also provide a degree of hermeticity to moisture, such as to meet a Joint Electron Device Engineering Council (JEDEC) specification requirement.

A first opening 116 is provided in the frame layer 108, and a second opening 118 is disposed in the lid layer 110. The first opening 116 and the second opening 118 are substantially aligned, and the first opening 116 illustratively has a smaller width (x-direction in the coordinate system of FIG. 1), or diameter, than that of the second opening 118. While the width or diameter of the first and second openings 116, 118 may be the same, it is beneficial to avoid an undercut, which can result in the formation of voids in the subsequent plating process to form the electrically and thermally conductive pillar 120. Accordingly, in a two layer, two lithography step used to form the first and second openings 116, 118, trying to make the first and second openings 116, 118 the same width/diameter can result in misalignment, and an undercut due to the misalignment. To avoid this, the width/diameter of the second opening 118 is made larger than that of the first opening 116. A notch 121 is formed in the frame layer 108 upon formation of the frame layer 108 over a seed layer 119, which is disposed over the electrical contact layer 106. In a representative embodiment, the first opening 116 forms an outer boundary to, and thus bounds the seed layer 119. As described more fully below, the seed layer 119 (bounded by dashed line) fosters a vertical (+z-direction in the coordinate system of FIG. 1) plating sequence used to form an electrically and thermally conductive pillar 120, which extends from an upper surface of the seed layer 119 through the first opening 116 and into the second opening 118. Stated somewhat differently, the seed layer 119 forms the landing pad for electrically and thermally conductive pillar 120 formed over the electrical contact layer 106. The frame layer 108 is formed over the seed layer 119, and the first opening 116 in general has a smaller width/diameter (x-direction in the coordinate system of FIG. 1) than the landing pad/seed layer. The first opening 116 provides the form for the plating up to form the electrically and thermally conductive pillar 120.

An electrically and thermally conductive layer 122 is formed over an upper surface of the electrically and thermally conductive pillar 120, and extends above an upper surface 124 of the lid layer 110 by a height (H).

As may be appreciated, the first and second electrodes 107, 109 are components of respective first and second acoustic resonators 126, 128, which are comprised of the piezoelectric layer 104 disposed over the device substrate 102, and the respective first and second electrodes 107, 109. The first and second acoustic resonators 126, 128 are disposed at active device areas at respective locations of the device substrate 102. The first and second cavities 112, 114 exist in the frame layer 108 at the respective locations, and the lid layer 110 provides a cover for the first and second cavities 112,114. The first and second acoustic resonators 126, 128 can be selectively electrically connected to form a portion of an acoustic filter (not shown in FIG. 1).

In certain representative embodiments, the first and second acoustic resonators 126, 128 are SAW resonators, such as described in commonly-owned U.S. Patent Applications and Patent Application Publications: U.S. patent application Ser. No. 15/639,124 filed on Jun. 30, 2017, naming Stephen Roy Gilbert et al. as inventors; U.S. Patent Application Publication No. 20170063331 filed on Jan. 28, 2016 naming Stephen Roy Gilbert, et al. as inventors; U.S. Patent Application Publication No. 20170063333 filed on Sep. 25, 2015, naming Stephen Roy Gilbert et al. as inventors; and U.S. Patent Application Publication No. 20170063329 filed on Aug. 25, 2015, naming Stephen Roy Gilbert, et al. as inventors. The entire disclosures of U.S. patent application Ser. No. 15/639,124 and U.S. Patent Application Publication Nos. 20170063331, 20170063333 and 20170063329 are specifically incorporated herein by reference.

In accordance with other representative embodiments, the first and second acoustic resonators 126, 128 provided in the first and second cavities 112, 114 may be BAW resonators, including film bulk acoustic wave resonators (FBARs) and surface mount bulk acoustic wave resonators (SMRs). To this end, a variety of devices, structures thereof, materials and methods of fabrication are contemplated for the BAW resonators of the apparatus 100, and other apparatuses of the present teachings described below. Various details of such devices and corresponding methods of fabrication may be found, for example, in one or more of the following U.S. patent documents: U.S. Pat. No. 6,107,721, to Lakin; U.S. Pat. Nos. 5,587,620, 5,873,153, 6,507,983, 7,388,454, 7,629,865, 7,714,684, and 8,436,516 to Ruby et al.; U.S. Pat. Nos. 7,369,013, 7,791,434 8,188,810, and 8,230,562 to Fazzio, et al.; U.S. Pat. No. 7,280,007 to Feng et al.; U.S. Pat. Nos. 8,248,185, and 8,902,023 to Choy, et al.; U.S. Pat. No. 7,345,410 to Grannen, et al.; U.S. Pat. No. 6,828,713 to Bradley, et al.; U.S. Pat. Nos. 7,561,009 and 7,358,831 to Larson, III et al.; U.S. Pat. No. 9,197,185 to Zou, et al.; U.S. Patent Application Publication No. 20120326807 to Choy, et al.; U.S. Pat. Nos. 9,243,316 and 8,673,121 to Larson III, et al.; U.S. Pat. No. 8,981,876 to Jamneala et al.; U.S. Pat. No. 9,479,139 to Ruby, et al.; U.S. Patent Application Publication No. 20130015747 to Ruby, et al.; U.S. Pat. No. 9,197, 185 to Zou, et al.; U.S. Pat. No. 9,484,882 to Burak, et al.; U.S. Pat. No. 9,679,765 to John L. Larson III; U.S. Pat. Nos. 9,136,819 and 9,602,073 to John L. Larson III, et al.; U.S. Pat. Nos. 9,450,167, and 9,590,165 to Zou, et al.; U.S. Pat. No. 9,455,681 to Feng, et al; and U.S. patent application Ser. No. 15/661,468 to Ruby, et al., filed on Jun. 27, 2017. The entire disclosure of each of the patents, patent application publications, and patent application listed above are hereby specifically incorporated by reference herein. It is emphasized that the components, materials and methods of fabrication described in these patents and patent applications are representative, and other methods of fabrication and materials within the purview of one of ordinary skill in the art are also contemplated.

The material selected for the electrically and thermally conductive pillar 120 is driven by a need to provide suitable thermal dissipation of heat from the ambient, and/or generated by the components of the apparatus 100, such as the first and second acoustic wave resonators 126, 128. In certain representative embodiments, the electrically and thermally conductive pillar 120 comprises copper. Alternatively, the electrically and thermally conductive pillar 120 may comprise nickel (Ni). While gold (Au) and silver (Ag) are contemplated, the cost of gold, and the corrosiveness of silver render their use for the electrically and thermally conductive pillar not viable. As will be appreciated, the greater the cross-sectional area of the electrically and thermally conductive pillar 120, the greater is its efficiency at removing heat. Moreover, since a conductor having a comparatively small cross-sectional areal dimension, and a greater height, has a comparatively large electrical resistance, and comparatively poor thermal conduction, the heights and cross-sectional areas of the first electrically and thermally conductive pillar 120 and the second electrically and thermally conductive layer 122 are selected to have comparatively large cross-sectional areas, and comparatively small heights. For purposes of illustration and not limitation, in a representative embodiment, the first and second electrically and thermally conductive layers 120, 122 are substantially circular in cross-section, and each have a diameter in the range of approximately 10 μm to approximately 200 μm, and a height (z-direction in the coordinate system of FIG. 1) in the range of approximately 10 μm to approximately 100 μm.

However, other considerations are required to account properly for mechanical issues in the apparatus 100. To this end, the apparatus 100 is often mounted to another structure, which has a coefficient of thermal expansion that may be different from that of the apparatus 100. Just by way of example, the apparatus 100 may be flip-chip mounted to a printed circuit board (PCB) (not shown) with the electrically and thermally conductive layer 122 making electrical and thermal contact to a contact (not shown) on the PCB. Because the PCB, the device substrate 102, and the piezoelectric layer 104 may have different coefficients of thermal expansion during heating and cooling of the PCB, the device substrate 102 and piezoelectric layer 104 expand and shrink, at different rates. These differentials in coefficients of thermal expansion, such as during so-called thermal shock (e.g., during a solder re-flow process), result in stress in the piezoelectric layer 104, and other components of the first and second acoustic resonators 126, 128. As will be appreciated by one of ordinary skill in the art, stress induced in the piezoelectric layer of any acoustic resonator (SAW or BAW) can have a deleterious impact on the performance of the acoustic resonator and any device that includes the acoustic resonator.

In order to compensate for the stresses that can be induced due to differences in the coefficients of thermal expansion between the apparatus 100 and any structure (e.g., PCB) to which it is mounted, the electrically and thermally conductive layer 122 comprises a material that is generally more pliable/malleable than the material of electrically and thermally conductive pillar 120. As such, the electrically and thermally conductive pillar 120 beneficially absorbs some of the stress that results from the difference in the coefficient of thermal expansion between the apparatus 100 and the PCB (or other structure to which the apparatus 100 is mounted). Just by way of example, copper (illustratively used for the electrically and thermally conductive pillar 120) has a TCE of approximately 17 ppm/K; tin-silver (Sn—Ag) solder (illustratively used for electrically and thermally conductive layer 122) has a TCE of approximately 25 ppm/K; silicon (illustratively used for the device substrate 102) has a TCE of 2.6 ppm/K; lithium tantalate (illustratively used for the piezoelectric layer 104) has a TCE of approximately 4 ppm/K to 16 ppm/K); and photocurable polymer (illustratively used for the frame layer 108 and lid layer 110) has a TCE of approximately 50 ppm/K. As such, the significant differences in TCE between the device substrate 102, the piezoelectric layer 104, the frame layer 108, and the lid layer 110, if not mitigated by the electrically and thermally conductive layer 122 could result in significant undesired lateral expansion, and, accordingly induced stress. However, by the present teachings, this absorbed stress is, therefore, not induced in the piezoelectric layer 104 or other components of the first and second acoustic resonators 126, 128. Thereby, the performance of the first and second acoustic resonators 126, 128 is degraded to a lesser degree than if the electrically and thermally conductive layer 122 were not implemented according to the present teachings.

In a representative embodiment, the electrically and thermally conductive layer 122 is tin (Sn) solder, or tin-lead (Sn—Pb) solder, or tin-silver (Sn—Ag) solder, or tin-silver-copper (Sn—Ag—Cu) solder. As will be appreciated, these materials afford a suitable degree of pliability to ensure absorption of stress, and the prevention of stress induced in the piezoelectric layer 104, and other components of the first and second acoustic resonators 126, 128.

More generally, the electrically and thermally conductive pillar 120 comprises a first material, and the electrically and thermally conductive layer 122 comprises a second material, with the coefficient of thermal expansion (CTE) of the first material being lower than a CTE of the second material. Similarly, the electrically and thermally conductive pillar 120 comprises a first material, and the electrically and thermally conductive layer 122 comprises a second material, with the electrical and thermal conductivity of the first material being greater than electrical and thermal conductivity the second material.

While the above-noted illustrative materials for the electrically and thermally conductive layer 122 are useful in mitigating unwanted induced stress, compared to the material used for the electrically and thermally conductive pillar 120, these materials have a lower electrical and thermal conductivity. Accordingly, in determining the volume of the electrically and thermally conductive pillar 120 and the electrically and thermally conductive layer 122, a trade-off may be used to realize a suitable amount of thermal and electrical conductivity, and a suitable degree of stress absorption by the overall structure comprising thermally conductive pillar 120 and electrically and thermally conductive layer 122. As will be appreciated from a review of FIG. 1, the relative volume of the thermally conductive pillar 120 and the electrically and thermally conductive layer 122 is controlled by controlling their respective heights (z-direction in the coordinate system depicted in FIG. 1). Illustratively, using copper for the electrically and thermally conductive pillar 120, and Sn—Pb solder for the electrically and thermally conductive layer 122, an upper surface 130 of the electrically and thermally conductive pillar 120 is in a range of approximately 0 µm (i.e., flush with the upper surface 124) to approximately 65.0 µm beneath the upper surface 124 of the lid layer. More generally, the upper surface 130 can be flush with the upper surface 124, or at a lower height (z-direction in the coordinate system of FIG. 1) than the upper surface 124 depending on the thicknesses (z-direction in the coordinate system of FIG. 1) of the frame and lid layers 108, 110. By contrast, the thermally conductive layer 122 has a height (H) extending above the upper surface 124 in the range of approximately 10.0 µm to approximately 100.0 µm.

Finally, in accordance with a representative embodiment, a passivation layer 140 is disposed over an upper surface of the electrical contact layer 106, the first and second electrodes 107, 109, and exposed portions of the piezoelectric layer 104 as shown. However, as shown in FIG. 1, the passivation layer 140 is not disposed entirely beneath the seed layer 119. As described more fully below, the passivation layer 140 improves the adhesion of the frame layer 108 to the electrical contact layer 106.

Figure 2:
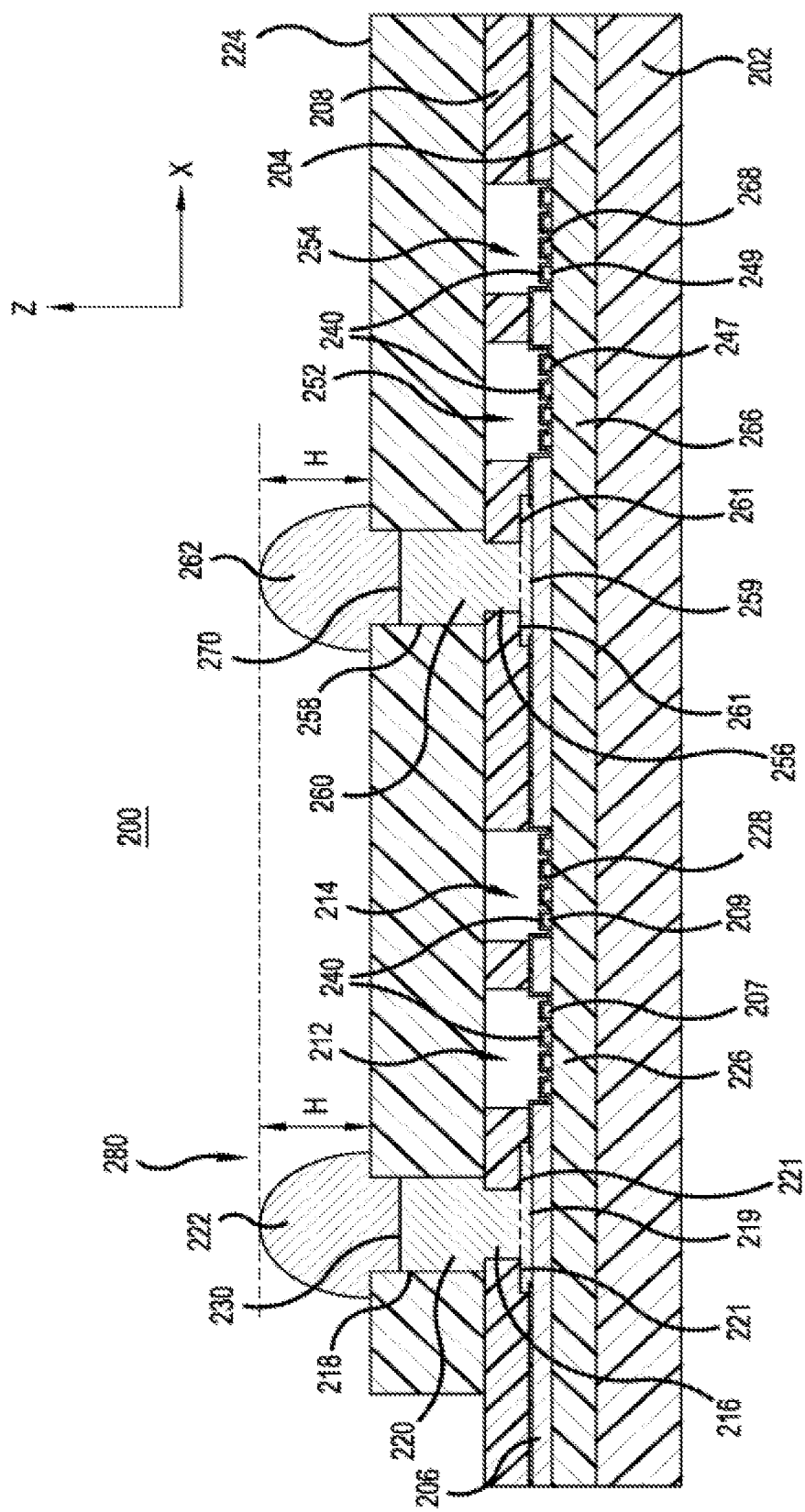
FIG. 2 is a cross-sectional view of a structure comprising a first electrically and thermally conductive pillar, and a second electrically and thermally conductive pillar according to a representative embodiment.

FIG. 2 is a cross-sectional view of a structure 200 in accordance with a representative embodiment. Many aspects and details of the various components of the structure 200 are common to those described above in connection with representative embodiments of FIG. 1. These common aspects and details are not necessarily repeated, but are nonetheless contemplated by the description of the structure 200.

Figure 3:
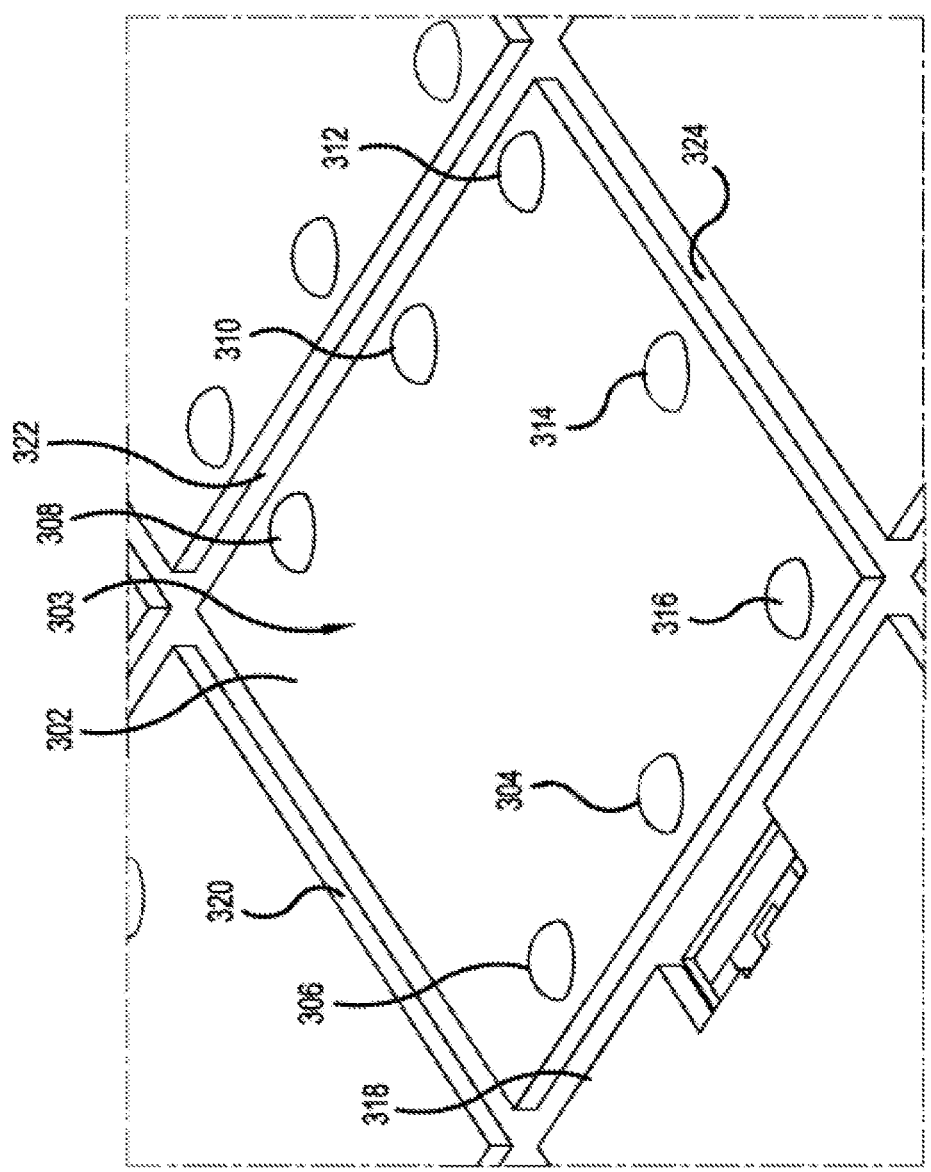
FIG. 3 is a perspective view of a packaged apparatus prior to dicing, according to a representative embodiment.

As noted above, and described more in connection with the representative embodiment of FIG. 3, a plurality of acoustic resonators, electrically and thermally conductive pillars, and electrically and thermally conductive layers can be provided on a single chip packaged at wafer-level, and configured to provide, for example acoustic filters, multiplexers, and other components. The structure 200 illustratively depicts a portion of such a chip, and in this case comprises two electrically and thermally conductive pillars, two electrically and thermally conductive layers, and four acoustic resonators.

Turning to FIG. 2, structure 200 comprises a device substrate 202, and a piezoelectric layer 204 disposed thereover. An electrical contact layer 206 (e.g., a metal layer) is provided over the device substrate 202, and allows the flow of current to various components of the structure 200, as described more fully below. As will be appreciated, the electrical contact layer 206 may comprise circuit traces (not shown) for carrying current to various components of the apparatus. A first electrode 207 and a second electrode 209 are disposed over the piezoelectric layer 204.

A frame layer 208 is disposed over the electrical contact layer 206, and comprises a photo-definable polymer material, the use and benefits thereof being described more fully below.

A lid layer 210 is disposed over the frame layer 208, and generally comprises a same material as the frame layer 208. A first cavity 212 and a second cavity 214 are formed in the frame layer 208, and the lid layer 210 provides a cover for each of the first and second cavities 212, 214. Beneficially, and as noted above, the first and second cavities 212, 214, which are formed by frame layer 208 and lid layer 210, are substantially hermetically sealed, thereby preventing an appreciable degree of contaminants and moisture from entering the first and second cavities 212, 214.

A first opening 216 is provided in the frame layer 208, and a third opening 218 is disposed in the lid layer 210. The first opening 216 and the third opening 218 are substantially aligned, and the first opening 216 illustratively has a smaller width (x-direction in the coordinate system of FIG. 1), or diameter, than that of the third opening 218. Alternatively, as noted above, the widths/diameters of the first opening 216 and the third opening 218 could be substantially the same.

A first notch 221 is formed in the frame layer 208 upon formation of the frame layer 208 over a first seed layer 219, which is disposed over the electrical contact layer 206. In a representative embodiment, the first opening 216 forms an outer boundary to, and thus bounds the first seed layer 219. As described more fully below, the first seed layer 219 (bounded by dashed line) fosters a vertical (+z-direction in the coordinate system of FIG. 2) plating sequence used to form a first electrically and thermally conductive pillar 220, which extends from an upper surface of the first seed layer 219 through the first opening 216 and into the third opening 218. A first electrically and thermally conductive layer 222 is formed over an upper surface of the electrically and thermally conductive pillar 220, and extends above an upper surface 224 of the lid layer 210 by a height (H).

As may be appreciated, the first and second electrodes 207, 209 are components of respective first and second acoustic resonators 226, 228, which are comprised of the piezoelectric layer 204 disposed over the device substrate 202, and the respective first and second electrodes 207, 209. The first and second acoustic resonators 226, 228 can be selectively electrically connected to form a portion of an acoustic filter (not shown in FIG. 2) on a single chip. As described above, the first and second acoustic resonators 226, 228 may be SAW resonators or BAW resonators.

Structure 200 also comprises a third electrode 247 and a fourth electrode 249, which are disposed over the piezoelectric layer 204. Lid layer 210 is disposed over the frame layer 208, and a third cavity 252 and a fourth cavity 254 are formed in the frame layer 208 with the lid layer 210 providing a cover for each of the third and fourth cavities 252, 254. Like the first and second cavities 212, 214, the third and fourth cavities 252, 254, which are formed by frame layer 208 and lid layer 210, are substantially hermetically sealed, thereby preventing an appreciable degree of contaminants and moisture from entering the third and fourth cavities 252, 254.

A second opening 256 is provided in the frame layer 208, and a fourth opening 258 is provided in the lid layer 210.

The second opening 256 and the fourth opening 258 are substantially aligned, and the second opening 256 illustratively has a smaller width (x-direction in the coordinate system of FIG. 2), or diameter, than that of the fourth opening 258. Alternatively, as noted above, the widths/diameters of the second opening 256 and the fourth opening 258 could be substantially the same.

A second notch 261 is formed in the frame layer 208 upon formation of the frame layer 208 over a second seed layer 259, which is disposed over the electrical contact layer 206. In a representative embodiment, the second opening 256 forms an outer boundary to, and thus bounds the second seed layer 259. As described more fully below, the second seed layer 259 fosters a vertical (+z-direction in the coordinate system of FIG. 2) plating sequence used to form a second electrically and thermally conductive pillar 260, which extends from an upper surface of the second seed layer 259 through the second opening 256 and into the fourth opening 258. A second electrically and thermally conductive layer 262 is formed over an upper surface of the second electrically and thermally conductive pillar 260, and extends above the upper surface 224 of the lid layer 210 by the height (H).

Again, as can be appreciated, the third and fourth electrodes 247, 249 are components of respective third and fourth acoustic resonators 266, 268, which are comprised of the piezoelectric layer 204 disposed over the device substrate 202, and the respective third and fourth electrodes 247, 249. The third and fourth acoustic resonators 266, 268 can be selectively electrically connected to form a portion of an acoustic filter (not shown in FIG. 2) on a single chip. As described above, the third and fourth acoustic resonators 266, 268 may be SAW resonators or BAW resonators.

As described above, the material selected for the first and second electrically and thermally conductive pillars 220, 260 is driven by a need to provide suitable thermal dissipation of heat from the ambient, and/or generated during by the components of the structure 200, such as the first, second, third and fourth acoustic wave resonators 226, 228, 266, 268. In certain representative embodiments, the first and second electrically and thermally conductive pillars 220, 260 comprise copper. Alternatively, the electrically and thermally conductive pillar 120 may comprise nickel (Ni). While gold (Au) and silver (Ag) are contemplated, the cost of gold, and the corrosiveness of silver render their use for the electrically and thermally conductive pillar not viable. As will be appreciated, the greater the cross-sectional area of the first and second electrically and thermally conductive pillars 220, 260, the greater is their efficiency at removing heat. However, as described above, other considerations are required to account properly for mechanical issues in the apparatus 100. To this end, the structure 200 is often mounted to another structure, which has a coefficient of thermal expansion (CTE) that may be different from that of structure 200. Because of the differences in the CTEs of the other structure (e.g., a PCB), and the device substrate 202 and piezoelectric layer 204, during heating and cooling, the structures to which structure 200 is attached expand and shrink, respectively, at different rates. These differentials in CTEs, such as during so-called thermal shock (e.g., during a solder re-flow process), result in stress in the piezoelectric layer 204, and other components of the first, second, third and fourth acoustic wave resonators 226, 228, 266, 268. As noted above, stress induced in the piezoelectric layer of any acoustic resonator (SAW or BAW) can have a deleterious impact on the performance of the acoustic resonator and any device that includes the acoustic resonator.

In order to compensate for the stresses that can be induced due to differences in the coefficients of thermal expansion between the structure 200 and any structure (e.g., PCB) to which it is mounted, the first and second electrically and thermally conductive layers 222, 262 comprise a material that is generally more pliable/malleable than the material of the first and second electrically and thermally conductive pillars 220, 260. As such, the first and second electrically and thermally conductive pillars 220, 260 beneficially absorb some of the stress that results from the difference in the coefficient of thermal expansion between the structure 200 and the other structure to which the structure 200 is mounted. As noted above, by the present teachings, absorbed stress is, therefore, not induced in the piezoelectric layer 204 or other components of the first, second, third and fourth acoustic wave resonators 226, 228, 266, 268. Thereby, the performance of the first, second, third and fourth acoustic wave resonators 226, 228, 266, 268 is degraded to a lesser degree than if the first and second electrically and thermally conductive layers 222, 262 were not so implemented.

In a representative embodiment, first and second electrically and thermally conductive layers 222, 262 are tin (Sn) solder, or tin-lead (Sn—Pb) solder, or Sn—Ag solder, or Sn—Ag—Cu solder as noted above. As will be appreciated, these materials afford a suitable degree of pliability to ensure absorption of stress, and the prevention of stress induced in the piezoelectric layer 204, and other components of the first, second, third and fourth acoustic wave resonators 226, 228, 266, 268.

More generally, the first and second electrically and thermally conductive pillars 220, 260 comprise a first material, and the first and second electrically and thermally conductive layers 222, 262 comprise a second material, with the coefficient of thermal expansion (CTE) of the first material being lower than a CTE of the second material. Similarly, first and second electrically and thermally conductive pillars 220, 260 comprise a first material, and the first and second electrically and thermally conductive layers 222, 262 comprise a second material, with the electrical and thermal conductivity of the first material being greater than electrical and thermal conductivity the second material. For purposes of illustration and not limitation, in a representative embodiment, the thermal conductivity of the electrically and thermally conductive layers 222, 262 are greater than approximately $10^6$ S/m, or greater than approximately 10 W/mK.

While the above-noted illustrative materials for the first and second electrically and thermally conductive layers 222, 262 are useful in mitigating unwanted induced stress, compared to the material used for the first and second electrically and thermally conductive pillars 220, 260, these materials have a lower electrical and thermal conductivity. Accordingly, in determining the heights and the cross-sectional areas of the first electrically and thermally conductive pillar 220 and the first electrically and thermally conductive layer 222, and the heights and the cross-sectional areas of the second electrically and thermally conductive pillar 260 and the second electrically and thermally conductive layer 262, a trade-off may be used to realize a suitable amount of thermal and electrical conductivity, and a suitable degree of stress absorption by the overall structure comprising first electrically and thermally conductive pillar 220 and the first electrically and thermally conductive layer 222, and by the second electrically and thermally conductive pillar 260 and the second electrically and thermally conductive layer 262. Moreover, for a given volume, since a conductor having a comparatively small cross-sectional areal dimension, and a greater height has a comparatively large electrical resistance, and comparatively poor thermal conduction, the heights and cross-sectional areas of the first electrically and thermally conductive pillar 220 and the first electrically and thermally conductive layer 222, and the heights and the cross-sectional areas of the second electrically and thermally conductive pillar 260 and the second electrically and thermally conductive layer 262 are selected to have comparatively large cross-sectional areas, and comparatively small heights.

As will be appreciated from a review of FIG. 2, the volumes of the first electrically and thermally conductive pillar 220 and the first electrically and thermally conductive layer 222, and the volumes of the second electrically and thermally conductive pillar 260 and the second electrically and thermally conductive layer 262, are controlled by controlling their respective heights (z-direction in the coordinate system depicted in FIG. 2). Illustratively, using copper for the first and second electrically and thermally conductive pillars 220, 260, and Sn—Pb solder for the first and second electrically and thermally conductive layers 222, 262, first and second upper surfaces 230, 270 of the first and second electrically and thermally conductive pillars 220, 260 are in a range of approximately 0 µm (i.e., flush with the upper surface 124) to approximately 65.0 µm beneath the upper surface 224 of the lid layer 210. More generally, the first upper surface 230 can be flush with the upper surface 224, or at a lower height (z-direction in the coordinate system of FIG. 2) than the upper surface 224 depending on the thicknesses (z-direction in the coordinate system of FIG. 2) of the frame and lid layers 208, 210.

As depicted in FIG. 2, the first and second electrically and thermally conductive layers 222, 262 each have a height (H) above the upper surface 224, and extend from respective first and second upper surfaces 230, 270 of the first and second electrically and thermally conductive pillars 220, 260. As noted above, this height (H) is in the range of approximately 10 µm to approximately 100 µm. Significantly, as delineated by dashed line 280 in FIG. 2, the height (H) of the first and second electrically and thermally conductive layers 222, 262 is substantially the same. Beneficially, the respective heights (H) of the first and second electrically and thermally conductive layers 222, 262 are less than approximately ±15%. As described more fully below, there are comparatively few voids or divits in the first electrically and thermally conductive pillar 220 and the first electrically and thermally conductive layer 222, and comparatively few voids or divits in the second electrically and thermally conductive pillar 260 and the second electrically and thermally conductive layer 262. Such voids or divits are common in known structures and, in order to meet the demands that flip-chip bonding be substantially planar, require connections (e.g., solder bumps) to be formed at a distance from conductive vias to which they are attached. As can be appreciated, the electrical connection required to connect the conductive via to the remote connection (e.g., solder bump) in known structures increases the overall resistance of the device. This increase of the electrical resistance, can impact performance of the devices connected in this known manner. By contrast, the first and second electrically and thermally conductive layers 222, 262 are at substantially the same height, and obviate the need to provide flip-chip contact sites remote from the electrically and thermally conductive pillars 220, 260. Beneficially, because of the precision of the height (H) realized by the present teachings, the path of thermal conduction is smaller, resulting in a lower thermal resistance, and an improved thermal dissipation. Similarly, by providing a shorter path for electrical conduction, the electrical resistance is reduced compared to other known structures having remote connections to the conductive bumps used in flip-chip bonding.

Finally, in accordance with a representative embodiment, a passivation layer 240 is disposed over an upper surface of the electrical contact layer 206, the first through fourth electrodes 207, 209, 247, 249 and exposed portions of the piezoelectric layer 104 as shown. However, as shown in FIG. 2, the passivation layer 240 is not disposed entirely beneath the first seed layer 219 or the second seed layer 259. As described more fully below, the passivation layer 240 improves the adhesion of the frame layer 208 to the electrical contact layer 206.

FIG. 3 is a perspective view of a packaged apparatus 300 prior to dicing, according to a representative embodiment. Many aspects and details of the various components of the packaged apparatus 300 are common to those described above in connection with representative embodiments of FIGS. 1 and 2. These common aspects and details are not necessarily repeated, but are nonetheless contemplated by the description of the packaged apparatus 300.

As shown in FIG. 3, the packaged apparatus 300 comprises a chip 302 having an upper surface 303. A first electrically and thermally conductive layer 304, a second electrically and thermally conductive layer 306, a third electrically and thermally conductive layer 308, a fourth electrically and thermally conductive layer 310, a fifth electrically and thermally conductive layer 312, a sixth electrically and thermally conductive layer 314, and a seventh electrically and thermally conductive layer 316 extend above the upper surface 303 of the chip 302. Notably, the first electrically and thermally conductive layer 304, the second electrically and thermally conductive layer 306, the third electrically and thermally conductive layer 308, the fourth electrically and thermally conductive layer 310, the fifth electrically and thermally conductive layer 312, the sixth electrically and thermally conductive layer 314, and the seventh electrically and thermally conductive layer 316 each extend by a substantially same height (e.g., "H" in FIG. 2) above the upper surface 303, providing benefits described above in connection with FIG. 2.

Similarly, like the electrically and thermally conductive layers described above in connection with the representative embodiments of FIGS. 1 and 2, each of the first electrically and thermally conductive layer 304, the second electrically and thermally conductive layer 306, the third electrically and thermally conductive layer 308, the fourth electrically and thermally conductive layer 310, the fifth electrically and thermally conductive layer 312, the sixth electrically and thermally conductive layer 314, and the seventh electrically and thermally conductive layer 316 is disposed over a respective electrically and thermally conductive pillar (not shown in FIG. 3), and provides selective electrical and thermal paths to packaged devices, such as acoustic resonators (not shown in FIG. 3) as described above in connection with the representative embodiments of FIGS. 1 and 2. As will be appreciated, combined with other circuitry (not shown in FIG. 3), the chip 302 provides a stand-alone component, such as a filter, or a multiplexer.

The chip 302 is bordered on its sides by a first scribe line 318, a second scribe line 320, a third scribe line 322, and a fourth scribe line 324. Dicing of the chip 302 and its removal of the chip from the remainder of the wafer is effected by sawing along the first scribe line 318, the second scribe line 320, the third scribe line 322, and the fourth scribe line 324.

Once diced, the chip 302 can be flip-chip mounted on another structure (e.g., a PCB), and because of the substantially identical heights above the upper surface 303 meets desired industry specifications.

Each of the first scribe line 318, the second scribe line 320, the third scribe line 322, and the fourth scribe line 324 has disposed therein an electrically conductive stripe, which are hidden in FIG. 3 by the frame layer. As described more fully below, these electrically conductive stripes provide current to effect a plating sequence to form the electrically and thermally conductive pillars of the present teachings. However, due to dicing of the chip 302 and its removal from the remainder of the wafer, these electrically conductive stripes are severed from the chip, and no current flows from the electrically conductive stripes to the individual components of the separated chip 302.

FIGS. 4A-4D are cross-sectional views of a process for fabricating an apparatus according to a representative embodiment. Many aspects and details of the various components of the apparatus are common to those described above in connection with representative embodiments of FIGS. 1, 2 and 3. These common aspects and details are not necessarily repeated, but are nonetheless contemplated by the description of the apparatus. In addition, certain aspects of the frame layer, and the lid layer, their materials, and methods used to form various features thereof are described in commonly owned U.S. patent application Ser. No. 15/445,643, entitled "Packaged Resonator with Polymeric Air Cavity Package" to V. Patil, et al. The entire disclosure of U.S. patent application Ser. No. 15/445,643 is specifically incorporated herein by reference.

Turning to FIG. 4A, a device substrate 402 has a piezoelectric layer 404 disposed thereover. An electrical contact layer 406 comprising, for example, aluminum (Al), or copper (Cu), or gold (Au), and having a thickness in the range of approximately 0.1 μm to approximately 5.0 μm is disposed over the piezoelectric layer 404. The substrate is illustratively a semiconductor layer, and may comprise structures and materials described in the above-incorporated U.S. Patent Applications to Stephen R. Gilbert, et al.

First and second electrodes 407, 409 are also disposed over the piezoelectric layer. As can be appreciated, the first and second electrodes 407, 409 are electrodes of SAW resonators. This is, again, merely illustrative, and the present teachings contemplate the packaging of other electronic components, such as BAW resonators (not shown), including film bulk acoustic wave resonators (FBARs) and surface mount bulk acoustic wave resonators (SMRs), such as those described in the above-incorporated patent documents.

In accordance with a representative embodiment, a passivation layer 410 is disposed over an upper surface of the electrical contact layer 406, the first and second electrodes 407, 409, and exposed portions of the piezoelectric layer 404 as shown. However, using a standard masking technique, a region 412 of the electrical contact layer 406 does not have any of the passivation layer 410 disposed thereover. As such, an upper surface of the electrical contact layer 406 in region 412 is exposed for reasons discussed more fully below. In accordance with a representative embodiment, the passivation layer 410 comprises undoped silicon dioxide ($SiO_2$), and has a thickness (z-direction in the coordinate system of FIG. 4A) in the range of approximately 5.0 nm to approximately 100.0 nm. Applicants have discovered that in addition to passivating the components to which it is deposited, $SiO_2$ provides suitable adhesion where it contacts a subsequently formed frame layer (not shown in FIG. 4A). Applicants note that while the passivation layer 410 may be made of silicon nitride ($Si_3N_4$), its adhesiveness to the polymer used for the frame layer, such as described below, is not as good as that of undoped $SiO_2$.

Turning to FIG. 4B, a seed layer 414 is disposed in region 412 using a known pattern resist and liftoff of the seed layer 414 over the region 412. In accordance with a representative embodiment, the seed layer 414 is selected for subsequent plating, which forms an electrically and thermally conductive pillar (not shown in FIG. 4B) such as those described above in connection with the representative embodiments of FIGS. 1 and 2. When the electrically and thermally conductive pillar is made of copper, in accordance with representative embodiments, the seed layer 414 comprises a layer of either Cu/Ti/W, or Cu/Ti, Cu/TiN or Cu/TiWON. Illustratively, the titanium of seed layer 414 has a thickness in the range of approximately 5.0 nm to approximately 5000 nm, the copper of seed layer 414 has a thickness approximately 100 nm to approximately 5000 nm. In these alternative embodiments, the TiN has a thickness in the range of approximately 5.0 nm to approximately 500 nm; tungsten has a thickness in the range of approximately 5.0 nm to approximately 500 nm; and TiWON has a thickness in the range of approximately 5.0 nm to approximately 500 nm.

Figure 4C:
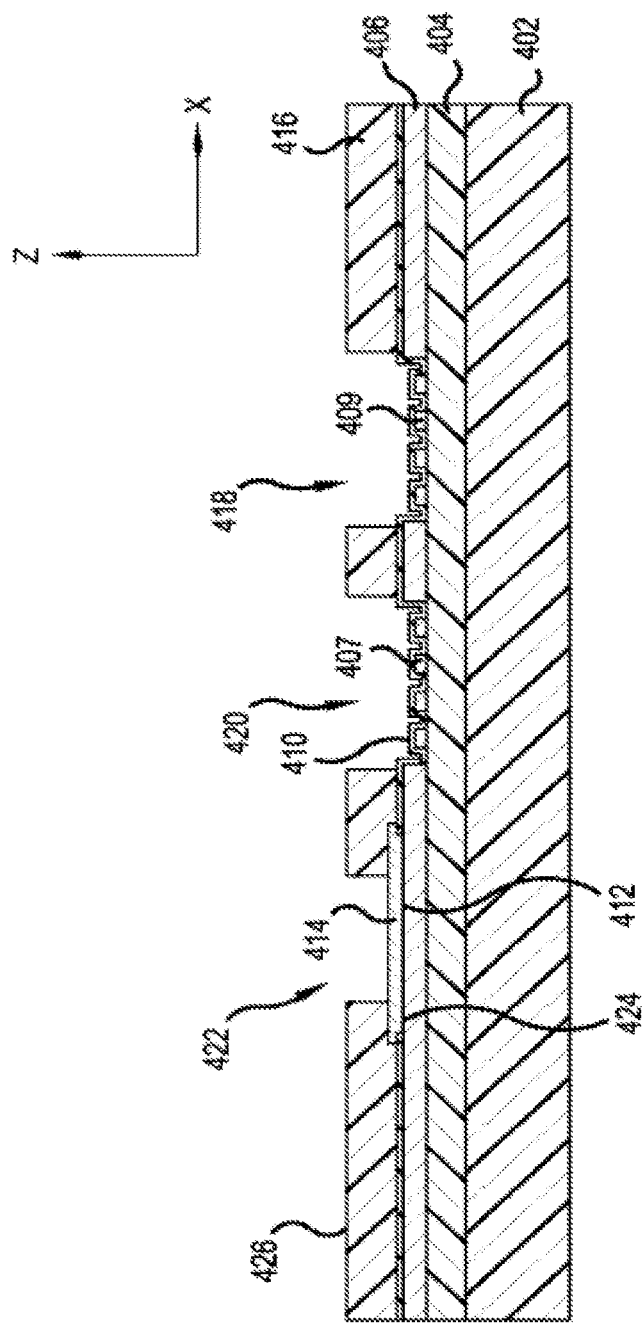

Turning to FIG. 4C, a frame layer 416 is provided over the electrical contact layer 406, and a portion of the seed layer 414. First and second cavities 418, 420, and first opening 422 are provided in the frame layer 416. The frame layer 416 comprises a photo-definable polymer material. In accordance with representative embodiments, the frame layer 416 comprises an epoxy material such as Su-8, or polyimide or benzocyclobutene (BCB). More generally, in addition to its photo-definable characteristic, the frame layer 416 must be able to survive the temperatures of the reflow process (e.g., stable at temperatures of 260° C. to 280° C.) and the overmold process In accordance with a representative embodiment, the frame layer 416 is laminated to the exposed upper surfaces of the electrical contact layer 406, the first and second electrodes 407, 409, the passivation layer 410, and the seed layer 414. The frame layer 416 is then exposed, and developed to remove the material of the frame layer 416, and reveal the first and second cavities 418, 420, and first opening 422. The frame layer 416 has an upper surface 426. Generally, the frame layer 416 has a thickness of approximately 5.0 μm to approximately 50.0 μm. Generally, the thickness of the frame layer 416 is governed by the need to provide a substantially planar upper surface 426 over which the lid layer is formed, and the need to provide enough vertical space (z-direction in the coordinate system of FIG. 4B) for the formed cavities so any sagging or bending of the subsequently formed lid layer does not make contact with any components (e.g., first and second electrodes 407, 409) in the cavities. As will be appreciated by one of ordinary skill in the art, it is difficult to form a dry resist film, which is used for the frame layer 416 to be thinner than approximately 5 μm or thicker than approximately 200 μm. Notably, the use of a dry film resist is merely illustrative, and alternatively, the frame layer 416 (and the subsequently formed lid layer) may be made of suitable known spin on liquid resist.

As depicted in FIG. 4C, a notch 424 is formed in the frame layer 416 upon formation of the frame layer 416 over a seed layer 119. In a representative embodiment, the first opening 422 forms an outer boundary to, and thus bounds the seed layer 414. As such, the frame layer 416 functions as the plating resist. Beneficially, the overlap results from the lithography tolerances, and allows only the seed layer 414 to be exposed to the plating bath.

Figure 4D:
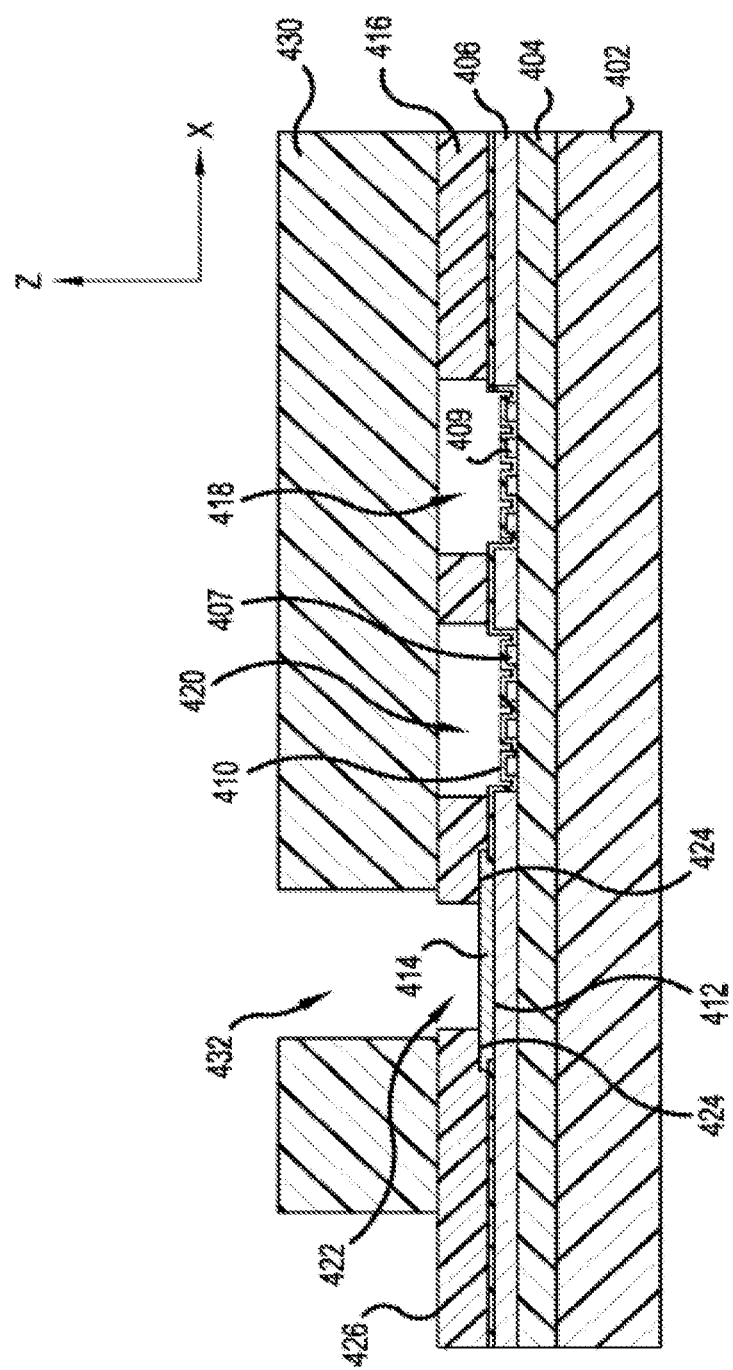

Turning to FIG. 4D, a lid layer 430 is provided over the upper surface 426 of the frame layer 416. Illustratively, the lid layer 430 may be made of the same material as the frame layer 416, such as those described above, and is beneficially a photo-definable polymer material. First, the lid layer 430 is laminated to upper surface 426 and provides lids for first and second cavities 418, 420. The lid layer 430 is then exposed, and developed to remove the material of the lid layer 430 to form a second opening 432. The lid layer 430 has an upper surface 434. Generally, the lid layer 430 has a thickness of approximately 5.0 µm to approximately 50 µm. The lid layer 430 provides protection to devices (e.g., acoustic resonators) disposed in the first and second cavities 418, 420. As can be appreciated, the thickness is dictated by the width (z-direction in the coordinate system of FIG. 4C) of the first and second cavities 418, 420, and the storage modulus of the material selected for the lid layer 430 at the temperature of overmolding, and the pressure during molding.

Figure 4E:
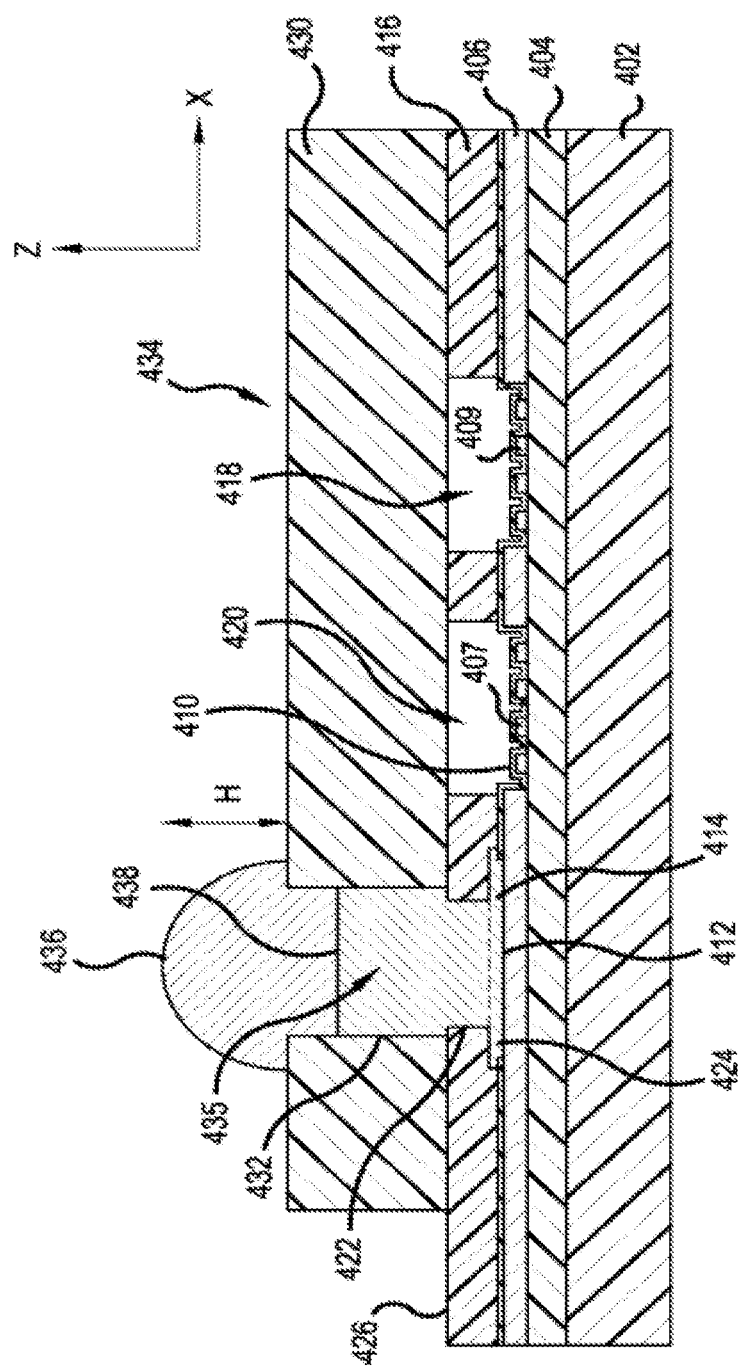

Turning to FIG. 4E, a completed apparatus 400 is shown. The apparatus 400 has an electrically and thermally conductive pillar 435, and an electrically and thermally conductive layer 436 disposed over the electrically and thermally conductive pillar 435. As discussed above, in a representative embodiment, the electrically and thermally conductive pillar 435 is made of copper, and the electrically and thermally conductive layer 436 is made of Sb—Pb solder. In such an embodiment, an upper surface 434 of the electrically and thermally conductive pillar 435 is in a range of approximately 0 µm (i.e., flush with the upper surface 434) to approximately 65.0 µm beneath the upper surface 434 of the lid layer 430. More generally, the upper surface 438 can be flush with the upper surface 434, or at a lower height (z-direction in the coordinate system of FIG. 4E) than the upper surface 434 depending on the thicknesses (z-direction in the coordinate system of FIG. 4E) of the frame and lid layers 416, 430. By contrast, the electrically and thermally conductive layer 436 has a height (H) extending above the upper surface 434 in the range of approximately 10.0 µm to approximately 100 µm. One beneficial aspect of the present teachings relates to the plating sequence used to form the electrically and thermally conductive pillar 435. To this end, the seed layer 414 is disposed at the bottom of the first and second openings 422, 432 as shown. The seed layer 414 is electrically connected to electrical circuit traces disposed in scribe lines (e.g., scribe lines depicted in FIG. 3). As such, prior to dicing of a chip, the electrical circuit traces in the scribe lines are connected, via the electrical contact layer 406, to the seed layer 414, and allow electrical power to be delivered to effect the plating to form the electrically and thermally conductive pillar 435. In accordance with a representative embodiment, electroplating with a mask (often referred to as patternplating) is used to form the electrically and thermally conductive pillar 435.

Figure 6:
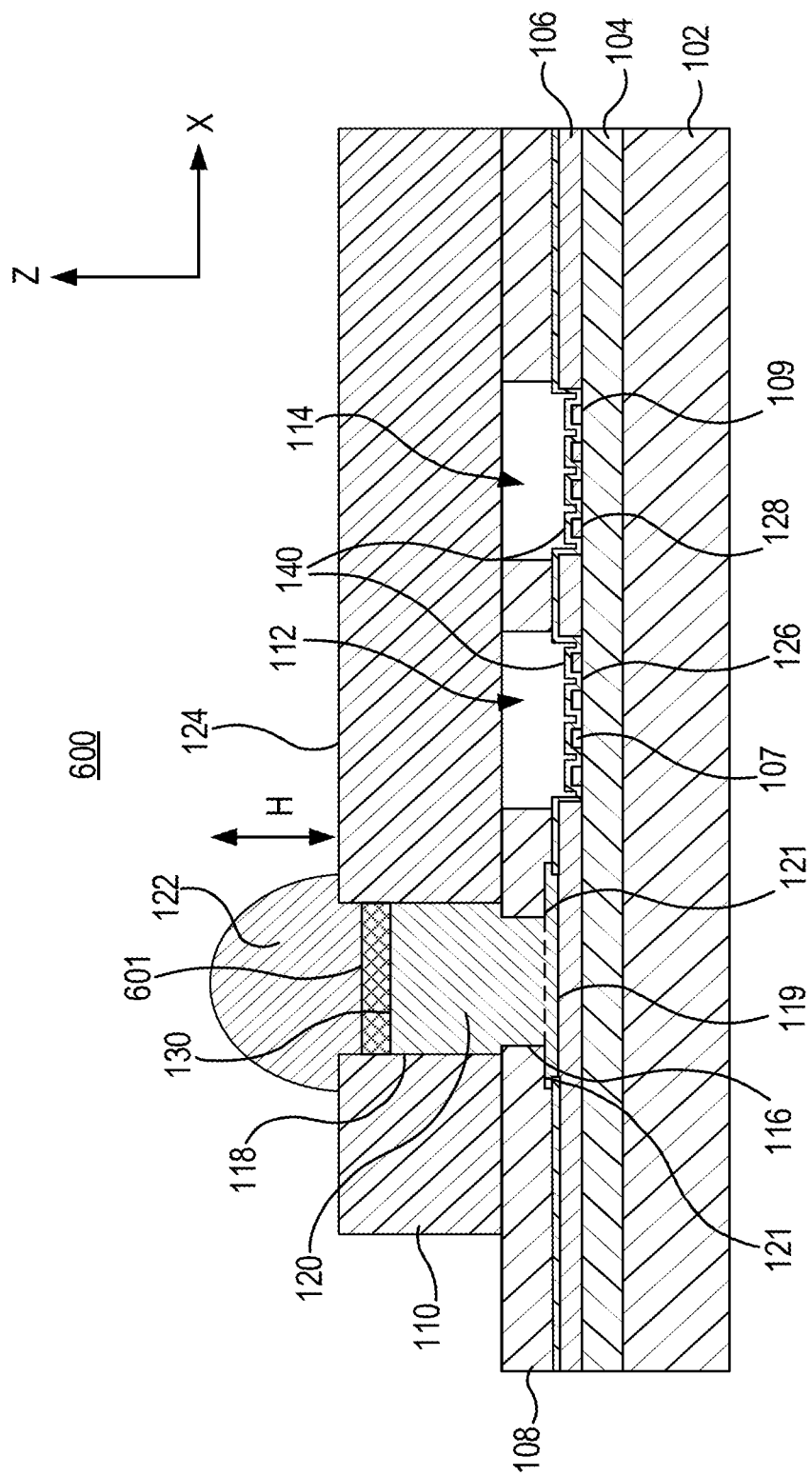
FIG. 6 is a cross-sectional view of an apparatus comprising an electrically and thermally conductive pillar according to a representative embodiment.

During the plating step used to form the electrically and thermally conductive pillar 435, the inner surfaces of the first and second openings 422, 432 of the frame layer 416, and the lid layer 430, respectively, function as a plating resist. By this arrangement, the plating sequence to form the electrically and thermally conductive pillar 435 results in upward or vertical (+z direction of the coordinate system of FIG. 4D) plating. Applicants have discovered that the vertical plating starting at the seed layer 414 and continuing to the upper surface 434 results in a comparatively solid electrically and thermally conductive pillar 435 that has a reduced number of voids compared to known plating methods. Moreover, using this upward plating method, the upper surface of the electrically and thermally conductive pillar 435 is comparatively flat, compared to pillars fabricated by known techniques, which often have a divot at the upper surface. By way of example, the upper surface 438 of the electrically and thermally conductive pillar 435 has a surface variation in height of approximately ±10% or less. As will be appreciated, providing a comparatively solid (i.e., comparatively few voids) electrically and thermally conductive pillar 435, having a comparatively flat upper surface 438 results in improved electrical performance and thermal grounding. Notably, the existence of voids adversely impacts electrical conductivity. Moreover, while voids do not generally impact the RF performance, the thermal conductivity scales with the effective cross section, which can be reduced by the existence of voids. Furthermore, voids can also impact reliability of the electrically and thermally conductive pillar 435, and can result in cracks in the electrically and thermally conductive layer 436. Finally, the electrically and thermally conductive layer 436 is formed over the upper surface 438 of the electrically and thermally conductive pillar 435. Referring now to FIG. 6, a cross-sectional view of an apparatus 600 comprising the electrically and thermally conductive pillar 120 is shown, according to a representative embodiment. The apparatus 600 is similar to the apparatus 100 of FIG. 1 except that the apparatus 600 includes a barrier layer 601. Notably, the barrier layer 601, such as nickel (Ni) can be provided over the upper surface 434 prior to forming the electrically and thermally conductive layer 436. Beneficially, the barrier layer 601 substantially prevents interdiffusion of copper from the electrically and thermally conductive pillar 435, and the solder used for the electrically and thermally conductive layer 436. Notably, copper diffusion into the solder results in deleterious voids. These voids can accumulate, and reduce the electrical conduction of the electrically and thermally conductive layer 436, and the stability of the connection. Because of the comparatively high precision of the dimensions and structure of the electrically and thermally conductive pillar 435, the height (H) of the electrically and thermally conductive layer 436 above the upper surface 434 of the lid layer 430 is comparatively precise and of uniform height with other electrically and thermally conductive pillars on a chop. Thus, a plurality of electrically and conductive thermal layers may be formed on a single die, and have a height above the upper surface of lid layer 430 that is substantially identical.

Figure 5:
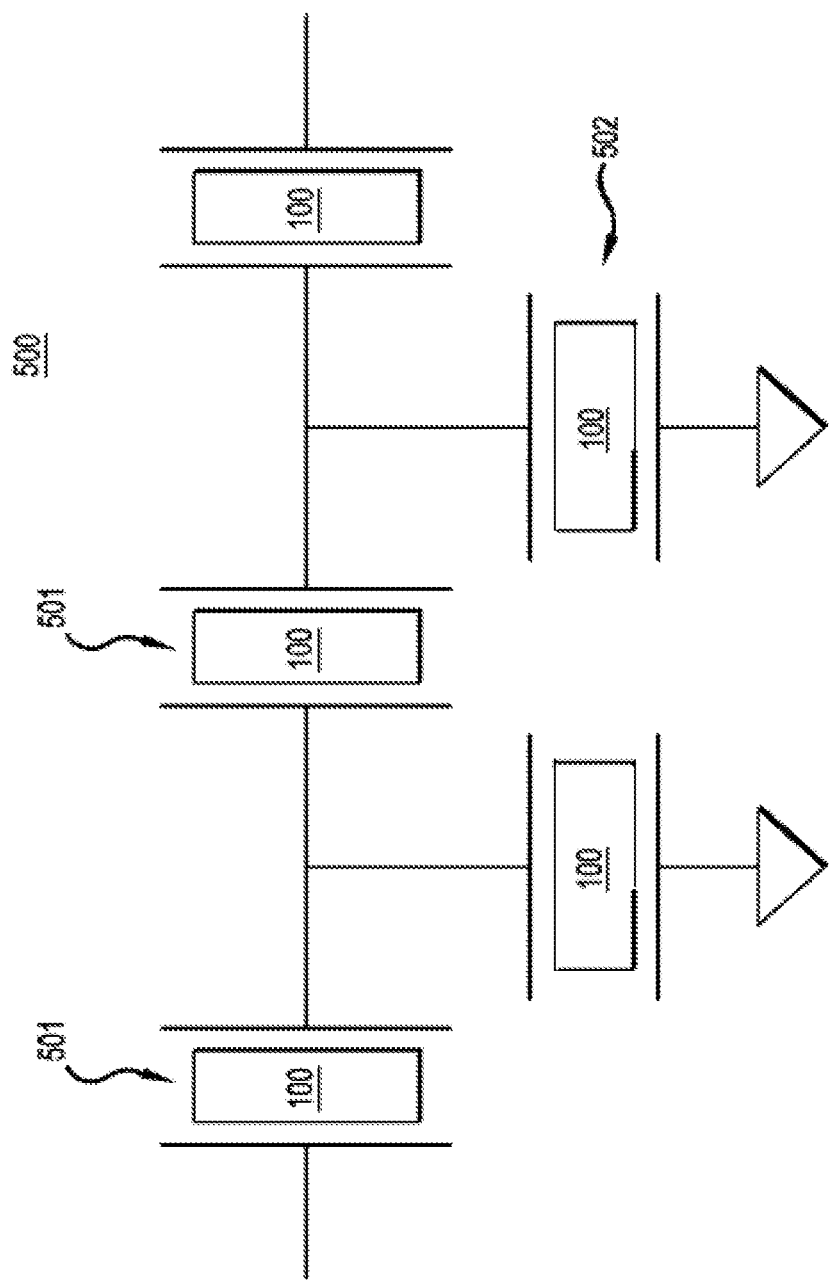
FIG. 5 is a simplified schematic block diagram of an acoustic filter in accordance with a representative embodiment.

FIG. 5 shows a simplified schematic block diagram of an electrical filter 500 in accordance with a representative embodiment. The electrical filter 500 comprises series acoustic resonators 501 and shunt acoustic resonators 502. The series acoustic resonators 501 and shunt acoustic resonators 502 may each comprise first and second acoustic resonators 126, 128, or other acoustic resonators described in connection with the representative embodiments of FIGS. 1~4E. As can be appreciated, the electrical filter 500 may be provided over a common substrate and in package form (such as chip 302). The electrical filter 500 is commonly referred to as a ladder filter, and may be used, for example, in duplexer applications. It is emphasized that the topology of the electrical filter 500 is merely illustrative, and other topologies are contemplated. Moreover, the acoustic resonators of the representative embodiments are contemplated in a variety of applications including, but not limited to duplexers.

The preceding description of the disclosed embodiments is provided to enable any person skilled in the art to practice the concepts described in the present disclosure. As such, the above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed:

1. An apparatus, comprising:
    a device substrate having an upper surface;
    a frame layer having an upper surface, the frame layer being disposed over the upper surface of the device substrate, wherein a first opening exists in the frame layer;
    a seed layer disposed over the device substrate and substantially bounded by the first opening;
    a lid layer having an upper surface, the lid layer disposed over the upper surface of the frame layer, wherein a second opening exists in the lid layer, and the second opening is aligned with the first opening;
    an electrically and thermally conductive pillar disposed in the first opening and the second opening, the electrically and thermally conductive pillar having an upper surface that is beneath the upper surface of the lid layer and has a surface height variation less than 10%; and
    an electrically and thermally conductive layer disposed over the upper surface of the electrically and thermally conductive pillar, and extending above the upper surface of the lid layer.

2. The apparatus of claim 1, wherein a portion of the seed layer is between a lower surface of the frame layer and the upper surface of the device substrate.

3. The apparatus of claim 1, wherein the electrically and thermally conductive pillar comprises a first material, and the electrically and thermally conductive layer comprises a second material, wherein a coefficient of thermal expansion (CTE) of the first material is lower than a CTE of the second material.

4. The apparatus of claim 1, wherein the electrically and thermally conductive pillar is substantially free of voids.

5. The apparatus of claim 1, wherein the upper surface of the electrically and thermally conductive pillar is in a range of approximately 0 µm to approximately 65.0 µm beneath the upper surface of the lid layer.

6. The apparatus of claim 1, wherein the upper surface of the electrically and thermally conductive pillar is substantially flush with the upper surface of the lid layer.

7. The apparatus of claim 1, wherein the electrically and thermally conductive pillar comprises copper.

8. The apparatus of claim 1, wherein the electrically and thermally conductive layer comprises a solder.

9. The apparatus of claim 8, wherein the solder comprises tin (Sn) or silver.

10. The apparatus of claim 1, wherein the frame layer, and the lid layer each comprise a photodefinable polymer material.

11. The apparatus of claim 1, further comprising an active device area at a location of the device substrate, wherein a cavity exists in the frame layer at the location, and the lid layer provides a cover for the cavity.

12. The apparatus of claim 1, further comprising a barrier layer disposed between the electrically and thermally conductive pillar, and the electrically and thermally conductive layer, wherein the barrier layer substantially prevents voids between the electrically and thermally conductive pillar, and the electrically and thermally conductive layer.

13. The apparatus of claim 12, wherein the electrically and thermally conductive pillar comprises copper, the electrically and thermally conductive layer comprises tin or silver, and the barrier layer comprises nickel.

14. The apparatus of claim 1, wherein the seed layer comprises copper and titanium.

15. A structure, comprising:
    a device substrate having an upper surface;
    a frame layer having an upper surface, the frame layer being disposed over the upper surface of the device substrate, wherein a first opening, and a second opening exists in the frame layer;
    a first seed layer disposed over the device substrate, and bounded by the first opening;
    a second seed layer disposed over the device substrate, and substantially bounded by the second opening;
    a lid layer having an upper surface, the lid layer disposed over the upper surface of the frame layer, wherein: a third opening exists in the lid layer, the third opening being aligned with the first opening; and a fourth opening exists in the lid layer, the fourth opening being aligned with the second opening;
    a first electrically and thermally conductive pillar disposed in the first opening and the third opening, the first electrically and thermally conductive pillar having an upper surface that is beneath the upper surface of the lid layer;
    a first electrically and thermally conductive layer disposed over the upper surface of the first electrically and thermally conductive pillar, and extending above the upper surface of the lid layer and has a surface height variation less than 10%;
    a second electrically and thermally conductive pillar disposed in the second opening and the fourth opening, the second electrically and thermally conductive pillar having an upper surface that is beneath the upper surface of the lid layer and has a surface height variation less than 10%; and
    a second electrically and thermally conductive layer disposed over the upper surface of the second electrically and thermally conductive pillar, and extending above the upper surface of the lid layer.

16. The structure of claim 15, wherein the first electrically and thermally conductive layer and the second electrically and thermally conductive layer have substantially a same height above the upper surface of the lid layer.

17. The structure of claim 15, wherein a portion of each of the first and second seed layers is between a lower surface of the frame layer and the upper surface of the device substrate.

18. The structure of claim 15, wherein the first and second electrically and thermally conductive pillars each comprise a first material, and the first and second electrically and thermally conductive layers each comprise a second material, wherein a coefficient of thermal expansion (CTE) of the first material is lower than a CTE of the second material.

19. The structure of claim 15, wherein the first and second electrically and thermally conductive pillars are substantially free of voids.

20. The structure of claim 15, wherein the upper surface of each of the first and second electrically and thermally conductive pillars is in a range of approximately 0 μm to approximately 65 μm beneath the upper surface of the lid layer.

21. The structure of claim 15, further comprising an active device area at a location of the device substrate, wherein a cavity exists in the frame layer at the location, and the lid layer provides a cover for the cavity.

22. The structure of claim 15, wherein the upper surface of the first electrically and thermally conductive pillar is substantially flush with the upper surface of the lid layer.

23. The structure of claim 15, wherein the upper surface of the second electrically and thermally conductive pillar is substantially flush with the upper surface of the lid layer.

24. The structure of claim 15, wherein each of the first and second seed layer comprises copper and titanium.

\* \* \* \* \*